TUNING DEVICE

Original Filed July 17, 1964 2 Sheets-Sheet 1

INVENTOR
ELDEN R DAVISSON
BY Robert [signature]
ATTORNEY

May 7, 1968 E. R. DAVISSON 3,382,431

TUNING DEVICE

Original Filed July 17, 1964 2 Sheets-Sheet 2

INVENTOR
ELDEN R. DAVISSON
BY Robert Levine
ATTORNEY

United States Patent Office 3,382,431
Patented May 7, 1968

3,382,431
TUNING DEVICE

Elden R. Davisson, Greenwood, Ind., assignor to P. R. Mallory & Co., Inc., Indianapolis, Ind., a corporation of Delaware Continuation of application Ser. No. 383,472, July 17, 1964. This application Apr. 21, 1966, Ser. No. 544,181
10 Claims. (Cl. 334—43)

This is a continuing application of application Ser. No. 383,472, filed July 17, 1964, now abandoned.

The present invention relates to electro-magnetic energy tuning devices operative over portions of the radio frequency band including therein the standard broadcast frequencies, AM frequencies, and the frequency modulation frequencies, FM frequencies. More particularly, the present application has specific application to such devices including means and methods for tuning or resonating arrangements utilized in the aforementioned devices.

The present invention relates to a tuning device employing a variable capacitance and a variable transmission line inductance coupled to a common tuning knob which tuning device will be dependable in operation and low in price. In addition, the present invention is a simple, efficient, accurate, and effective AM-FM frequency tuner.

The tendency toward miniaturization of electronic elements such as transistors, electronic tubes, resistors, and capacitors and the use of printed circuit boards has made it necessary in electronic circuit utilizing tuning devices to reduce the physical dimensions of the tuning devices and associated apparatus to permit the effective use of the tuning device. Compactness of construction of the tuning devices is found to present problems that were not considered significant in prior art tuning devices; these problems are: accessibility of all areas of the tuner for efficient repair, use of light weight components to reduce the weight of the device, and the problem of cooling the electronic components of the tuning device. The construction of the tuning device of the present invention solves the aforementioned problems by utilizing a printed circuit board which has mounted thereon the electronic components of the tuning device and in conjunction therewith concentric pairs of variable transmission line inductances and a pair of variable capacitances coupled to a common shaft, and an associated selector tuner switch for permitting use of either the concentric pairs of transmission line inductances or the pair of variable capacitances.

It is therefore an object of the present invention to provide a miniature tuning device variable over several frequency ranges that has improved constructional features permitting more efficient operation of the miniature tuning device.

It is another object of the present invention to provide a miniature tuning device utilizing a plurality of pairs of variable inductance transmission lines and a pair of variable capacitances coupled to a common adjusting means so as to simultaneously change the capacitance of the capacitors and the inductance of the transmission lines.

Yet another object of the present invention is to provide a plurality of pairs of concentric transmission lines for linear inductive tuning of a plurality of tunable electronic circuits.

Still another object of the present invention is to provide a tunable device that has its resonant frequency varied linearly with respect to the rotation of an associated shaft.

It is another object of the present invention to provide printed pairs of concentric transmission line conductors utilized in tuning an electronic device.

Yet another object of the present invention is to provide a plurality of pairs of printed circuit transmission line inductances and an associated rotatable shaft, the transmission lines so shaped to obtain a constant frequency difference between associated circuitry at all angular shaft positions.

Another object of the present invention is to provide a novel arrangement, organization, and interconnection of electronic components which cooperate to provide improved operating characteristics.

Still another object of the present invention is to provide an improved AM-FM tuning device having optimum reliability characteristics afforded by a compact construction having a minimum number of components.

The present invention in another of its aspects relates to novel features of the instrumentalities of the invention described herein for teaching the principal object of the invention and to the novel principles employed in the instrumentalities whether or not these features and principles may be used in the said object and/or in the said field.

With the aforementioned objects enumerated, other objects will be apparent to those persons possessing ordinary skill in the art. Other objects will appear in the following description, appended claims, and appended drawings. The invention resides in the novel construction, combination, arrangement, and cooperation of elements as hereinafter described and more particularly as defined in the appended claims.

The appended drawings illustrate several novel and different embodiments of the present invention, constructed to function in the most advantageous modes devised for the practical application of the basic principles involved in the hereinafter described invention.

Figure 1:
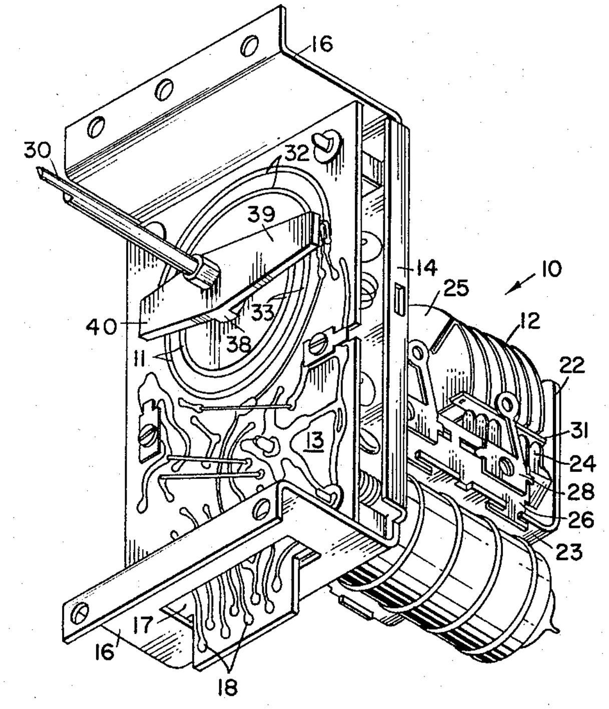
FIGURE 1 is a perspective view of the novel tuning device illustrating the arrangement and positioning of the concentric pairs of transmission line inductances in relation to the variable capacitance and printed board circuitry.

Generally speaking, the means and methods of the present invention relate to a variable tuning device for tuning AM broadcast stations and FM broadcast stations.

A U-shaped chassis has mounted in spaced relationship thereto a printed circuit board. The printed circuit board includes a plurality of pairs of printed conductors or transmission lines printed thereon. The pairs of printed conductors are curved and have a radial extent of approximately 180 degrees. At least one of the pairs of conductors has its midpoint displaced approximately 180 degrees from the midpoint of at least one other of said pairs of conductors. The pairs of radial conductors are concentric about a rotatable shaft. A plurality of positionable spring contact means are coupled to rotatable shaft in a manner to be described hereinafter. At least one of the plurality of spring contact means rides on the surface of each one of the pairs of conductors to predeterminately vary the electrical lengths of the pairs of the conductors thereby vary the inductance of the conductors. Since the length of the pairs of conductors is proportional to the inductance of the pairs of conductors, varying the length of the conductors by means of repositioning the spring contact means on the surface thereof, will vary the amount of inductance of the conductors. Tunable electrical circuitry is coupled to an extremity of the pairs of conductors, thus varying the inductance of the conductors tunes the associated electrical circuitry to receive a selected frequency within a frequency range.

The present invention has provisions for tuning a particular frequency of a plurality of frequencies within a selected frequency range, the particular frequency range selected from a plurality of frequency ranges. The device of the present invention includes a U-shaped chassis which has rigidly coupled thereto and in parallel spaced relationship with the connecting portion between the legs of the U-shaped chassis. The printed circuit has provision not only for electrical elements and coupling therebetween but also has provision for at least two arcuate pairs of conductors or transmission lines. The pairs of arcuate conductors have a radial extent of about 180 degrees. One of the pairs of conductors has its midpoint displaced approximately 180 degrees from the midpoint of the other pair of conductors. At least two spring contact means are coupled to a rotatable shaft and are displaced about 180 degrees each from the other. One of the spring contact means rides on the surface of one of the pairs of conductors to predeterminately vary the electrical lengths of the conductors. A second spring contact means rides on the other pair of conductors. Tunable electric circuitry is coupled to a terminal end of each of the two pairs of conductors. The circuitry is tuned by varying the lengths of each pair of conductors by repositioning the spring contact riding thereon by rotating the shaft to which the spring contact is coupled. Repositioning the spring contacts varies the amount of inductance of the conductors thereby tuning the associated electrical circuitry to receive a selected frequency. A variable capacitor including a stator means and a rotor means is utilized to tune the associated electrical circuitry in a frequency range that the pairs of conductors cannot tune. The rotor means is coupled to the shaft that the spring means is coupled, thereby permitting simultaneous variation of the capacitance of the capacitor and inductance of the pairs of conductors by rotational displacement of the shaft. A switch means is provided to select the output of either the variable capacitor or the output of the pairs of conductors thereby tuning the electrical circuitry to receive a selected frequency within at least two predetermined ranges of frequencies.

Figure 2:
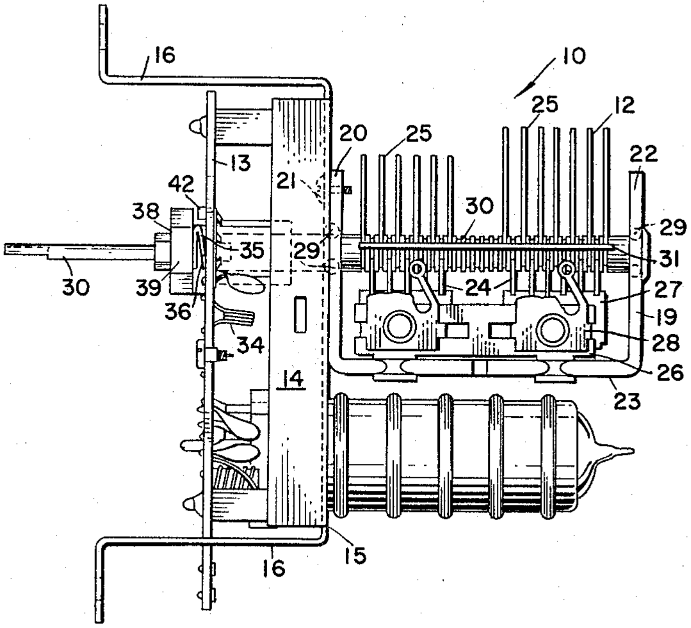
FIGURE 2 is a side view of the novel tuning device illustrating a rotatable common shaft coupling the pairs of concentric transmission lines and the variable capacitance in such a manner so as to simultaneously vary the inductance of the transmission lines and the capacitance of the capacitor.
Figure 3:
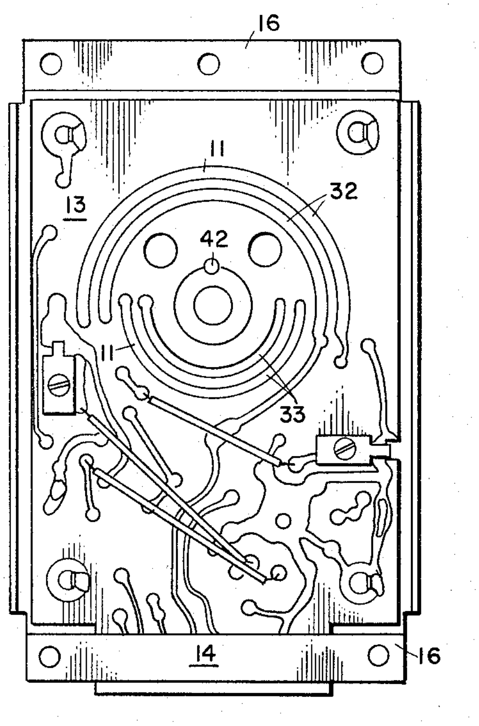
FIGURE 3 is a vertical view of the pairs of concentric transmission lines inductances and their respective positions on the printed circuit board.
Figure 4:
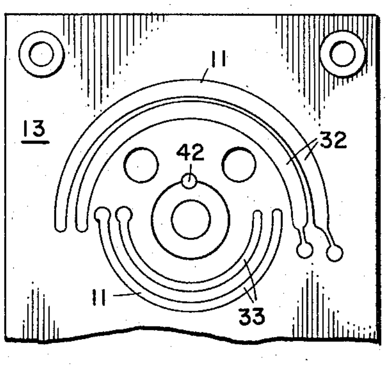
FIGURE 4 is a partial vertical view of the concentric transmission lines illustrating the pairs of lines shaped to provide predetermined tracking with shaft rotation.

Referring now to the drawings, which illustrate the preferred embodiment of the present invention, the tuning device is generally indicated by numeral 10. The tuning device includes a plurality of variable transmission lines 11, variable capacitance 12, and printed circuit board 13. The printed circuit board has coupled thereto electrical elements such as inductance, capacitance, and resistance. A U-shaped mounting chassis 14 retains the printed circuit board in substantially rigid spaced relationship therefrom by any suitable means such as mounting pegs 15 punched from the chassis and bent at a right angle thereto. The printed circuit board is attached to the mounting pegs by any suitable means such as solder or press fitting bolts. The mounting chassis provides support means for any desired electrical circuits such as amplifiers, oscillators, mixers and the like. The chassis is constructed of a light metal and has each leg portion thereof flanged to provide rigidity for the electrical elements retained thereon and a means whereby the tuner can be attached to or detached from an electronic circuit utilizing a tuner. As illustrated by FIGURE 1 and FIGURE 2 the printed circuit board is spaced from and parallel to the connecting portion 15 of legs 16. Such mounting permits an open chassis design thereby improving the convection cooling characteristics of the tuning device and as a result thereof reducing the temperature of the electrical elements and thereby increasing the electrical elements life. An extremity of the printed circuit board projects through aperture 17 of leg 16 to provide electrical access to and from the tuning device to associated electrical components to which the tuning device is electrically coupled. The access terminals on the printed circuit board are generally shown at 18. Exposed access terminals allow a person to troubleshoot for failures in the tuner without removing the tuner from the associated circuitry.

A C-shaped mounting bracket 19 has a leg portion 20 thereof securely coupled to connecting portion 15 by any suitable means such as bolt 21. Legs 20 and 22 of the C-shaped bracket are retained in parallel spaced relationship by a coupling portion 23. A shaft 30 is rotatably journalled in legs 20 and 22 and is spaced in parallel relationship with respect to coupling portion 23 of the C-shaped bracket. Two separate sets of stator plates 24 are fixedly coupled to the coupling portion of the C-shaped bracket. The rotor shaft is journalled by means of planetary bearings 29 to legs 20 and 22 and carries thereon two sets of rotor plates 25. The rotor plates are retained in spaced relationship by plate 31 coupled to an extremity of each rotor plate as shown in FIGURE 1. Plate 31 also prevents rotation of the rotor plates beyond a predetermined position by contacting portions of the stator plates.

The rotor plates are rotatably interleaved with the stator plates in such a fashion that rotatable displacement by the rotor plates with respect to the stator plates predeterminately varies the capacitance of variable capacitor 12. The stator plates are securely coupled to insulating means 26 by electrically conducting metallic plate 27 which plate is fixedly coupled to the insulating means. The metallic plate is coupled to terminal 28 by any suitable electrically conducting means such as solder. Terminal 28 is fixedly coupled to the insulating means by any suitable means such as welding, solder, or rivets. The insulating means or dielectric means is pressure fitted with the coupling portion of the C-shaped bracket and at a right angle thereto. To provide a means whereby the capacitance of capacitor 12 can be varied, shaft 30 is projected a predetermined length through leg 20, through connecting portion 15, and through the printed circuit board. A knob (not shown) is attached to this extremity of the shaft allowing manual rotation of the shaft to a predetermined position within a limited rotational displacement.

Printed circuit board 13 has printed thereon by any suitable means such as photo-etching pairs of arcuate transmission lines 11 that are concentric about shaft 30. The transmission lines are four in number each one of which makes an arc of about 180 degrees. It is understood that the number of transmission lines utilized would vary in accordance with the magnitude of the range of frequencies and the number of circuits to be tuned. The pair of arcuate portions of the arcuate transmission lines 32 are substantially parallel and positioned in a predeterminate spaced relationship each from the other. The pair of arcuate transmission lines 32 is concentric with shaft 30. The other pair of arcuate transmission lines 33 are substantially parallel in a predeterminately spaced relationship each from the other. The pair of arcuate transmission lines 33 are concentric with shaft 30 and pair of transmission lines have their respective midpoints on their arcs displaced about 180 degrees from the midpoints of the arcs of the pair of arcuate transmission lines 32. Each pair of transmission lines is constructed so as to be proportional in length to a desired wave length. One extremity of the pair of transmission lines 32 is electrically coupled to inductive coil 34 whereas an extremity of the pair of transmission lines 33 is electrically coupled to an inductive coil not shown. The respective inductance coils are utilized to facilitate fine tuning of the lower frequency signals receivable by the transmission lines.

Figure 5:
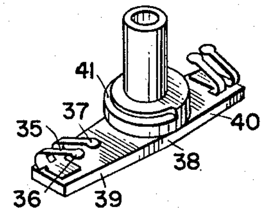
FIGURE 5 is a perspective view of the plurality of wiper arms that ride on the surface of the concentric transmission lines.

Cooperating with transmission line 32 is a first spring contact 35 comprised of wiper arm 36 and wiper 37. This contact may have any suitable construction but preferably has the construction as shown in FIGURE 5. The construction comprises a mounting portion 38 suitably apertured so as to be fixedly coupled to shaft 30 to thereby rotate with said shaft. Mounting portion 38 has radially extending arms 39 and 40 which arms each have a spring contact 35 fixedly coupled thereto in any suitable manner such as by heat staked, interference fit or by rivets. The spring contacts are constructed of any suitable electrically conducting material. Mounting portion 38 is constructed of any suitable insulating material such as plastic or the like. It is seen that the radially extending arms are opposite one another so that when mounting portion 38 is rotationally displaced by manual rotation of shaft 30, the spring contacts ride on the surface of the associated transmission lines. The midpoints of the pairs of transmission lines are displaced by 180 degrees for several reasons one of which is to effectively balance the displacement forces tending to twist or tilt the shaft thereby causing undue bearing wear. In addition it is seen that the balancing of the displacement forces places equal force on each spring contact thereby preventing undue frictional wear on either of the spring contacts.

An arcuate slot 41 is cut into the outer periphery of the portion of mounting member 38 that mates with shaft 30. The slot is arcuate and extends about 180 degrees. A pin 42 interfits with slot 41 in such a manner so as to permit only a 180 degree rotational displacement by shaft 30 in either the clockwise or counterclockwise direction.

It is seen that rotational displacement of the spring contacts by rotating shaft 30 will vary the electrical length of the concentric transmission lines. It is seen to this length of transmission line one must consider other parts of the tuner functioning as part of the transmission line. A capacitor coupled across the transmission line may be utilized for increasing the electrical length of the line without increasing the physical length of the line. An inductance coil coupled across the transmission line can be utilized to provide fine tuning of the lower frequency signals receivable by the transmission line and also decreases the electrical length of the transmission lines without decreasing the physical length of the lines.

The spring contact 35 is in effect a shorting bar. When displacing the spring contact to a different position across the pair of transmission lines so as to tune the associated electrical circuitry to receive signals within the FM band, one terminal of transmission lines 32 is coupled to a load such as an R.F. stage whereas the other terminal of the lines is coupled to electrical ground. It is seen that one terminal of transmission line 33 is coupled to an oscillator whereas the other terminal of the transmission line is coupled to electrical ground. The length of the two pairs of transmission lines is varied by varying the position of the spring contact in riding on the surface of the respective transmission lines. From the construction described hereinbefore it is seen that transmission line 32 and transmission line 33 are comprised each of two parallel, arcuate semicircular conducting lines that are not electrically coupled unless spring contact 35 has a wiper 37 riding on each arcuate semicircular transmission line. The spring contact serves to short circuit each portion of the transmission line to the other portion of the transmission line at the point of contact thereof by the spring contact.

It is seen that when the rotor plates and the spring contacts are rotated by the shaft, the maximum displacement of either the rotor plates of the capacitor or the spring contacts associated with the pairs of transmission lines is about 180 degrees. The inductance of the transmission lines is varied by the rotation that varied the capacitance of capacitor 12.

A switch (not shown) is provided marked with indicia such as AM and FM. If the switch is in the AM position, the variable capacitor is utilized to tune the AM band of frequencies. If the switch is in the FM position, the pairs of variable length transmission lines are utilized to tune the FM band of frequencies. An indicator dial (not shown) may be carried by shaft 30 and marked with the appropriate frequencies or wave lengths. A graduated scale (not shown) may also be mounted near the shaft for indicating the wavelengths or the frequencies.

Figure 6:
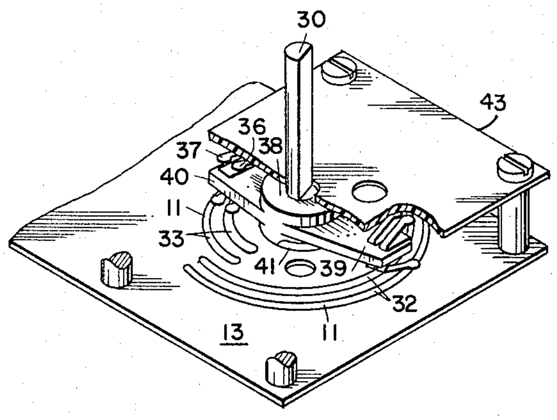
FIGURE 6 is a fragmentary perspective view illustrating the positioning of the wiper arms riding on the concentric transmission lines.

The embodiment of FIGURE 6 illustrates a feature not described elsewhere. A plate 43 is securely placed in spaced parallel relationship with respect to the portion of the printed circuit board containing transmission lines 32 and transmission lines 33. Plate 43 is spaced about one half of an inch from the printed circuit board and said plate has thereon arcuate, concentric transmission lines similar to those of the printed circuit board. The conductive transmission lines of the plate and of the printed circuit board may be bridged by a pair of contact springs mechanically coupled back to back but not electrically coupled as shown in FIGURE 6 which are resilient to insure proper contact between the arcuate concentric transmission lines of both the plate and the printed circuit board and between the contact elements. The cascading of pairs of transmission lines and coupling each pair of transmission lines mechanically by means of a shaft permits the simultaneous tuning of a plurality of tunable stages by rotating a single shaft to a predetermined position. It is seen that the cascaded pairs of transmission lines may be electrically coupled end to end. The length of the transmission line is capable thereafter of much greater variation allowing reception of a greater range of frequencies in accordance with the particular requirements of the circuits to which they are coupled.

While the invention is illustrated and described in its preferred embodiments, it will be understood that modifications and variations may be made without departing from the scope of the novel concepts of this invention and as set forth in the appended claims.

Having thus described my invention, I claim:

1. An electromagnetic energy tuning device for accepting a determined range of frequencies comprising: a U-shaped supporting chassis, said chassis having an apertured top plate and a plurality of legs integrally connected and dependent therefrom substantially at right angles thereto, one of said legs having an aperture, an apertured printed circuit board connected to and held by mounting pegs carried by said top plate in spaced parallel relationship with said plate so that said aperture of said plate and said aperture of said printed circuit board are axially aligned, a terminal end of said board protruding through said aperture of said one leg so that printed terminals on said board are readily accessible, a plurality of printed inductors placed flat on one side of said board and tunable by a wiping means coupled to and displaced by a shaft projecting through said axially aligned apertures of said printed circuit board and said plate, the other side of said board being spaced from and facing said plate, said other side of said board supporting cooperating electrical components connected to said inductors in the space between said side and said plate, a C-shaped mounting bracket having aperture legs, one of said apertured legs fixedly connected to said top plate in such a manner as to axially align said apertures of said bracket with said apertures of said plate and said printed circuit board so that said shaft projects therethrough, a rotatably tuned capacitance means carried by said bracket, said capacitance means having rotor plates connected to and displaced by rotational displacement of said shaft, said capacitance means connected to said electrical components, said shaft adapted upon rotation to simultaneously displace said wiping means on said inductors and displace said rotor plates of said capacitance means so as to accept a desired frequency, and said board further having a position along said mounting pegs allowing for rapid dissipation of heat generated by said electrical components during operation of said tuning device whereby the efficiency of said tuning device is increased.

2. An electromagnetic energy tuning device according to claim 1 wherein said wiping means comprises means connected to and rotatable with said shaft, said means including contact carrying arms riding on said printed inductors such that rotational displacement of said shaft tunes said inductors.

3. An electromagnetic energy tuning device according to claim 1 wherein said printed circuit inductors are concentric and said wiping means comprises means connected to and rotatable with said shaft, said means including a pair of diametrically opposed arms extending therefrom, each of said arms carrying U-shaped spring contact means, said means displaced by rotational displacement of said shaft thereby tuning said inductors.

4. An electromagnetic energy tuning device according to claim 3, wherein said wiping means further includes means for limiting the arcuate displacement of said shaft to about 180° degrees.

5. An electromagnetic energy tuning device according to claim 1 wherein said printed inductors are two curved concentric pairs and have a radial extent of 180 degrees, said pairs of inductors having a midpoint displaced about 180 degrees from a midpoint of said other pair of inductors, and said wiping means connected to said shaft and having a pair of diametrically opposed arms radially extending therefrom, each of said arms carrying U-shaped spring contact means, said wiping means displaced by rotational displacement of said shaft thereby tuning said inductors, said wiping means further including means for limiting arcuate displacement of said shaft to about 180 degrees.

6. An electromagnetic energy tuning device according to claim 1, wherein said capacitance means is a rotatably tunable electrostatic capacitance means including stator means and rotor means, said electrical components coupled to said stator, said capacitance means positioned on top of said plate, said rotor coupled to and displaced by said shaft.

7. An electromagnetic energy tuning device for accepting a determined range of frequencies comprising: a U-shaped supporting chassis, said chassis having an apertured top plate and a plurality of legs integrally connected and dependent therefrom substantially at right angles thereto, one of said legs having an aperture, an apertured printed circuit board connected to and held by mounting pegs carried by said top plate in spaced parallel relationship with said plate so that said aperture of said plate and said aperture of said printed circuit boards are axially aligned, a terminal end of said board protruding through said aperture of said one leg so that printed terminals on said board are readily accessible, a plurality of pairs of printed inductors placed flat on one side of said board, said pairs of printed inductors curved to have a determined radial extent, at least one pair of said printed inductors having a point displaced predeterminately from a point of at least one other of said pairs of printed inductors, said printed inductors curved about a rotatable shaft, wiping means riding on said two pair of said printed inductors to predeterminately vary the electrical lengths of said inductors, said shaft projecting through said axially aligned apertures of said printed circuit board and said plate, said other side of said board being spaced from and facing said plate, said other side of said board supporting cooperating electrical components connected to said inductors in the space between said side and said plate, a C-shaped mounting bracket having apertured legs, one of said apertured legs fixedly connected to said top plate thereby axially aligning said apertures of said bracket with said apertures of said plate and said printed circuit board so that said shaft projects therethrough, a rotatably tuned capacitance means carried by said bracket, said capacitance means having rotor plates connected to and displaced by rotational displacement of said shaft, said capacitance means connected to said electrical components, said shaft adapted upon rotation to simultaneously displace said wiping means on said inductors and displace said rotor plates of said capacitance means so as to accept a desired frequency, and said board further having a position along said mounting pegs allowing for rapid dissipation of heat generated by said electrical components during operation of said tuning device whereby the efficiency of said tuning device is increased.

8. A frequency tuning device according to claim 7, wherein said wiping means includes means fixedly coupled to and rotatable with said shaft including a pair of diametrically opposed arms radially extending from said shaft, each of said arms carrying a U-shaped spring contact means riding on one of said inductors to predeterminately vary the electrical lengths of said inductors, said contact means further including means for limiting arcuate displacement thereof to about 180 degrees.

9. A frequency tuning device according to claim 8, wherein said means for limiting arcuate displacement of said shaft includes means having an arcuate slot having an arcuate length of about 180 degrees interfitting with a stop pin so as to limit arcuate displacement of said means to about 180 degrees.

10. A frequency tuning device according to claim 7 wherein said printed inductors are two curved concentric pairs and have a radial extent of 180 degrees, said pairs of inductors having a midpoint displaced about 180 degrees from a midpoint of said other pair of inductors, and said wiping means connected to said shaft and having a pair of diametrically opposed arms radially extending therefrom, each of said arms carrying U-shaped spring contact means, said wiping means displaced by rotational displacement of said shaft thereby tuning said inductors, said wiping means further including means for limiting arcuate displacement of said shaft to about 180 degrees.

References Cited

UNITED STATES PATENTS

| | | | |
|---|---|---|---|
| 2,508,030 | 5/1950 | Karns | 174—68.5 |
| 2,511,586 | 6/1950 | Hubbard | 334—72 |
| 2,718,623 | 9/1955 | Yoder et al. | 334—49 |
| 2,794,081 | 5/1957 | Luhn | 317—101 |
| 2,835,796 | 5/1958 | King | 334—43 |
| 2,858,440 | 10/1958 | Giacoletto | 334—69 |
| 3,056,098 | 9/1962 | Baldwin | 334—43 |
| 3,124,720 | 3/1964 | Green | 317—101 |

HERMAN KARL SAALBACH, *Primary Examiner.*

R. F. HUNT, L. ALLAHUT, *Assistant Examiners.*